(12) United States Patent
Guo

(10) Patent No.: US 11,935,785 B2
(45) Date of Patent: Mar. 19, 2024

(54) METHOD OF MANUFACTURING A SEMICONDUCTOR STRUCTURE, AND A SEMICONDUCTOR STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 372 days.

(21) Appl. No.: 17/453,168

(22) Filed: Nov. 1, 2021

(65) Prior Publication Data
US 2023/0017390 A1    Jan. 19, 2023

Related U.S. Application Data

(63) Continuation of application No. PCT/CN2021/118772, filed on Sep. 16, 2021.

(30) Foreign Application Priority Data

Jul. 19, 2021   (CN) .......................... 202110813571.7

(51) Int. Cl.
*H01L 21/768*   (2006.01)
*H01L 21/311*   (2006.01)

(52) U.S. Cl.
CPC .. *H01L 21/76897* (2013.01); *H01L 21/31144* (2013.01); *H01L 21/76811* (2013.01); *H01L 21/76883* (2013.01)

(58) Field of Classification Search
CPC ......... H01L 21/76897; H01L 21/31144; H01L 21/76811; H01L 21/76883
See application file for complete search history.

(56) References Cited

U.S. PATENT DOCUMENTS

| | | | | |
|---|---|---|---|---|
| 10,937,791 | B1 * | 3/2021 | Huang | H10B 12/485 |
| 2006/0118913 | A1 * | 6/2006 | Yi | H10N 70/8418 |
| | | | | 257/E21.613 |
| 2008/0087926 | A1 * | 4/2008 | Park | H10B 53/30 |
| | | | | 257/295 |
| 2022/0208783 | A1 * | 6/2022 | Seo | H01L 21/823418 |

FOREIGN PATENT DOCUMENTS

CN       108511440 B    12/2020

* cited by examiner

*Primary Examiner* — Telly D Green
*Assistant Examiner* — Andre C Stevenson
(74) *Attorney, Agent, or Firm* — Syncoda LLC; Feng Ma

(57) ABSTRACT

A method of manufacturing a semiconductor structure includes: providing a base and a dielectric layer on the base, the base in an array region being provided with discrete capacitive contact plugs and a first conductive layer being formed on a top surface of the capacitive contact plugs; sequentially forming a conversion layer and a target layer on the first conductive layer and the dielectric layer, the target layer in the array region and the first circuit region being provided with first openings through the target layer; patterning the target layer in the array region as well as in the first circuit region and the second circuit region to form a second opening and a third opening; etching the conversion layer to form a first trench; forming a filling layer filling the first trench and removing the conversion layer to form a second trench filled by a second conductive layer.

19 Claims, 11 Drawing Sheets

METHOD OF MANUFACTURING A SEMICONDUCTOR STRUCTURE, AND A SEMICONDUCTOR STRUCTURE

CROSS-REFERENCE TO RELATED APPLICATIONS

This is a continuation application of International Patent Application No. PCT/CN2021/118772 filed on Sep. 16, 2021, which claims priority to Chinese Patent Application No. 202110813571.7 filed on Jul. 19, 2021. The disclosures of the above-referenced applications are hereby incorporated by reference in their entirety.

BACKGROUND

Storage is memory equipment for storing information in modem information technology, and is widely used in various electronic products. According to whether storage can be read directly by a central processor, the storage can be classified into memory and external memory, and the memory can be classified into dynamic random-access memory (DRAM), static random-access memory (SRAM) and video random access memory (VRAM), etc.

SUMMARY

The embodiments of the present disclosure relate to but are not limited to a method of manufacturing a semiconductor structure and a semiconductor structure.

An aspect of the embodiments of the present disclosure provides a method of manufacturing a semiconductor structure. The method includes: providing a base and a dielectric layer located on the base. The base includes an array region, a first circuit region and a second circuit region, and the first circuit region is located between the array region and the second circuit region; the base in the array region is provided with discrete capacitive contact plugs; the base in the first circuit region is provided with a first gate and the first circuit region is further provided with first conductive plugs on opposite sides of the first gate; the base in the second circuit region is provided with a second gate and the second circuit region is further provided with second conductive plugs on opposite sides of the second gate; the first gate, the second gate and the capacitive contact plugs are located within the dielectric layer; and a first conductive layer is formed on a top surface of the capacitive contact plugs. The method also includes forming a conversion layer and a target layer sequentially on the first conductive layer and the dielectric layer. The target layer in the array region and the first circuit region is provided with first openings through the target layer, and a pattern density of the first opening in the array region is greater than a pattern density of the first opening in the first circuit region. The method also includes: patterning the target layer between adjacent first openings in the array region to form a second opening through the target layer, and patterning the target layer in the first circuit region and the second circuit region to form a third opening through the target layer; etching the conversion layer by use of the target layer having the first opening, the second opening and the third opening as a mask to form a first trench within the conversion layer; forming a filling layer that fills the first trench and removing the conversion layer to form a second trench through the filling layer. The second trench in the array region exposes a top surface of the first conductive layer, the second trench in the first circuit region exposes a top surface of the first conductive plug, and the second trench in the second circuit region exposes a top surface of the second conductive plug. The method further includes forming a second conductive layer that fills the second trench.

In another aspect of the embodiments of the present disclosure, the semiconductor structure manufactured by the method as described above is provided.

BRIEF DESCRIPTION OF THE DRAWINGS

One or more embodiments are exemplarily illustrated by the pictures in the accompanying drawings, which, unless specifically stated, do not constitute scale limitations.

DETAILED DESCRIPTION

The embodiments of the present disclosure provide a method of manufacturing a semiconductor structure, in which a filling layer provided with a second trench is formed on a dielectric layer, and a target material is filled into a target pattern in the filling layer, thereby forming a desired second conductive layer.

To make the objectives, technical solutions and advantages in the embodiments of the present disclosure clearer, the embodiments of the present disclosure will be described in detail with reference to the accompanying drawings. However, those of ordinary skill in the art will appreciate that many technical details have been proposed in various embodiments of the present disclosure for better understanding of the present disclosure. However, the technical solutions described in the present disclosure may be realized even without these technical details as well as various changes and modifications according to the following embodiments.

There are regions that are not easy to be etched in a process of forming a conductive layer.

FIG. 1 to FIG. 25 illustrate schematic diagrams of a semiconductor structure corresponding to various processes in a method of manufacturing the semiconductor structure according to embodiments of the present disclosure.

In some embodiments, a formed semiconductor structure including a DRAM device is taken as an example. A device corresponding to an array region is a DRAM device. In other embodiments, the formed semiconductor structure may further include static random access memory, video random access memory, etc.

Figure 1:
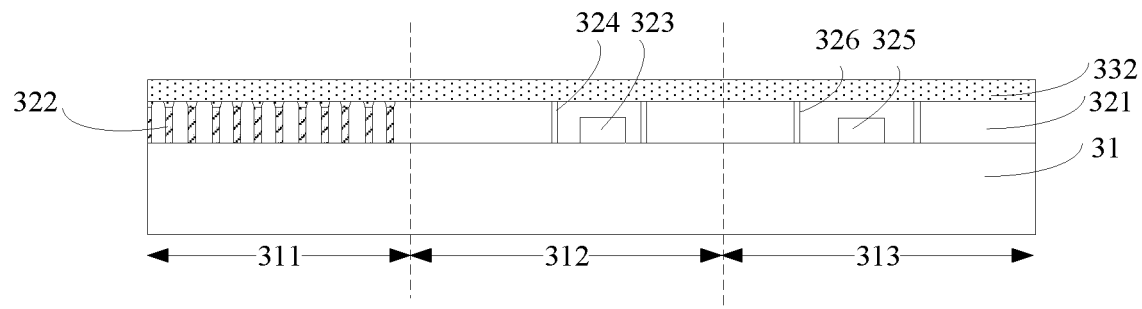
FIG. 1 is a first schematic diagram of a semiconductor structure corresponding to various processes in a method of manufacturing the semiconductor structure according to embodiments of the present disclosure.
Figure 2:
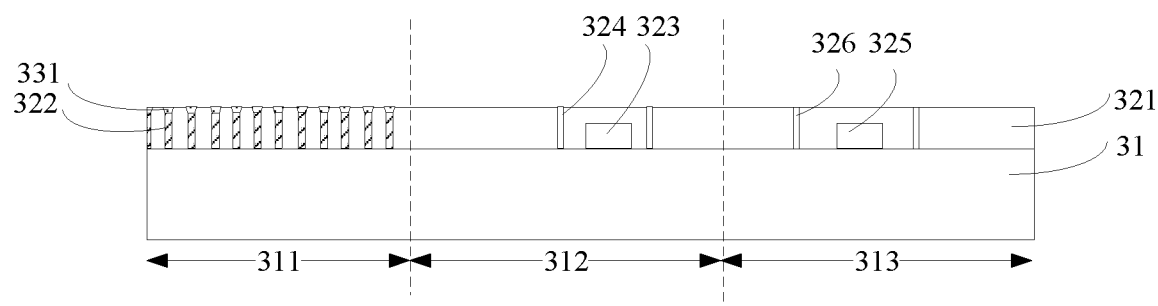
FIG. 2 is a second schematic diagram of a semiconductor structure corresponding to various processes in a method of manufacturing the semiconductor structure according to embodiments of the present disclosure.

Referring to FIG. 1 and FIG. 2, a base 31 including an array region 311, a first circuit region 312 and a second circuit region 313 as well as a dielectric layer 321 located on the base 31 are provided. The first circuit region 312 is located between the array region 311 and the second circuit region 313. The base 31 in the array region 311 is provided with discrete capacitive contact plugs 322. The base 31 in the first circuit region 312 is provided with a first gate 323 and the first circuit region 312 is further provided with first conductive plugs 324 on opposite sides of the first gate 323. The base 31 in the second circuit region 313 is provided with a second gate 325 and the second circuit region 313 is further provided with second conductive plugs 326 on opposite sides of the second gate 325. The first gate 323, the second gate 325 and the capacitive contact plugs 322 are located within the dielectric layer 321. A first conductive layer 331 is formed on a top surface of the capacitive contact plugs 322.

In some embodiments, the base 31 may include a substrate and a word line structure located within the substrate, and may further include an isolation structure. The material of the substrate may be silicon, germanium, silicon germanium, silicon carbide, or the like.

The array region 311 is a region where a memory array is to be formed, and the memory array may include a word line, a bit line, and a memory capacitor. The base 31 in the array region 311 may be provided with a word line structure as well as source and drain electrodes on opposite sides of the word line structure. The capacitive contact plugs 322 may be electrically connected to the source electrodes by contact. In addition, the dielectric layer 321 in the array region 311 may be also provided with a bit line structure. The material of the capacitive contact plug 322 may be polysilicon or metal, and the metal may be copper, aluminum, tungsten, or the like.

The first circuit region 312 may be a region where a core circuit is to be formed, and the second circuit region 313 may be a region where a peripheral circuit is to be formed.

The base 31 in the first circuit region 312 may be further provided with source and drain electrodes on opposite sides of the first gate 323, and each of the first conductive plugs 324 may be electrically connected to the source and drain electrodes in the first circuit region 312, respectively. The base 31 in the second circuit region 313 may be also provided with source and drain electrodes on opposite sides of the second gate 325, and each of the second conductive plugs 326 may be electrically connected to the source and drain electrodes in the second circuit region 313, respectively.

It should be noted that the array region 311, the first circuit region 312, and the second circuit region 313 are different regions of the semiconductor structure with reference to the base 31, and do not refer to different portions of the base 31 alone. The array region 311, the first circuit region 312, and the second circuit region 313 refer to the base 31 in corresponding regions and other film layers formed on the base 31.

The dielectric layer 321 may be made of an insulating material such as silicon oxide, silicon nitride, silicon oxynitride, or silicon oxycarbonitride. In some embodiments, the dielectric layer 321 may be a single layer structure, and in other embodiments, the dielectric layer 321 may also be a stacked structure.

The top surface of the first conductive layer 331 is larger than the top surface area of the capacitive contact plug 322, so that the alignment accuracy required by the subsequent process of forming the second conductive layer is reduced and the process difficulty is reduced. Furthermore, the material of the first conductive layer 331 may be different from that of the capacitive contact plug 322. In some embodiments, the resistivity of the material of the first conductive layer 331 may be greater than the resistivity of the capacitive contact plug 322, and the material of the first conductive layer 331 may be tungsten, which facilitates reducing the contact resistance between the subsequently formed second conductive layer and the first conductive layer 331, thereby increasing the operating speed of the semiconductor structure.

In some embodiments, with reference to FIG. 1 and FIG. 2, the process of forming the first conductive layer 331 may include that: the dielectric layer 321 in the array region 311 is patterned, openings are formed within the dielectric layer 321, each of the openings exposes a top surface of the corresponding capacitive contact plug 322; a first conductive film 332 filling the openings is formed, and the first conductive film 332 is also located on the top surface of the dielectric layer 321. Referring to FIG. 2, the first conductive film 332 is planarized to remove a portion of the first conductive film 332 higher than the top surface of the dielectric layer 321, and the remaining first conductive film 332 is served as the first conductive layer 331.

Referring to FIG. 3 to FIG. 9, a conversion layer 341 and a target layer 362 are formed sequentially on the first conductive layer 331 and the dielectric layer 321, the target layer 362 in the array region 311 and the first circuit region 312 is provided with first openings 36a through the target layer 362, and a pattern density of the first opening 36a in the array region 311 is greater than a pattern density of the first opening 36a in the first circuit region 312.

In some embodiments, the material of the conversion layer 341 may be silicon nitride or polysilicon, and the material of the target layer 362 may be tetraethyl orthosilicate TEOS.

In some embodiments, the target layer 362 may be provided with rows of first openings 36a arranged in a preset direction. Each of the first openings 36a has a first extension direction. An included angle between the first extension direction and the preset direction may be 120 degrees.

The arrangement density of the capacitive contact plugs 322 in the array region 311 is greater than the arrangement density of the first conductive plugs 324 in the first circuit region 312. The pattern density of the first openings 36a in the array region 311 is greater than the pattern density of the first openings 36a in the first circuit region 312 so as to enable the capacitive contact plugs 322 to correspondingly connect to the first conductive plugs 324.

Figure 3:
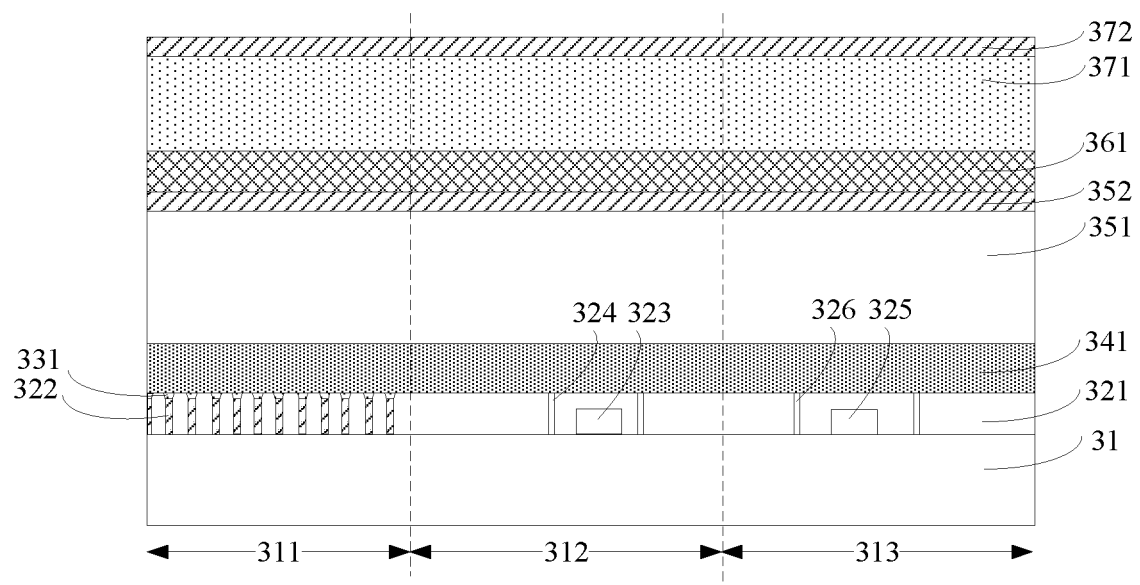
FIG. 3 is a third schematic diagram of a semiconductor structure corresponding to various processes in a method of manufacturing the semiconductor structure according to embodiments of the present disclosure.

The process of forming the target layer 362 in some embodiments will be described below with reference to FIG. 3 to FIG. 9:

Referring to FIG. 3, an initial target film 361 is formed on the conversion layer 341.

Specifically, a continuous initial target film 361 is formed on the conversion layer 341 in the array region 311, the first circuit region 312, and the second circuit region 313.

The initial target film 361 provides a process basis for subsequent formation of the target layer, that is, the material of the initial target film 361 is as same as the material of the target layer.

In some embodiments, before forming the initial target film 361, the method may further include: sequentially forming an amorphous carbon layer 351 and an intermediate layer 352 on the conversion layer 341, and forming the initial target film 361 on a surface of the intermediate layer 352. Accordingly, a target layer is subsequently formed on the surface of the intermediate layer 352.

In some embodiments, the amorphous carbon layer 351 may cooperate with the intermediate layer 352 to serve as a hard mask layer to facilitate improving the quality of a pattern formed by subsequent etching of the conversion layer 341. The material of the intermediate layer 352 is different from that of the conversion layer 341, for example, the intermediate layer 352 may be a silicon oxynitride material.

In other embodiments, the initial target film may also be formed directly on the surface of the conversion layer.

Figure 4:
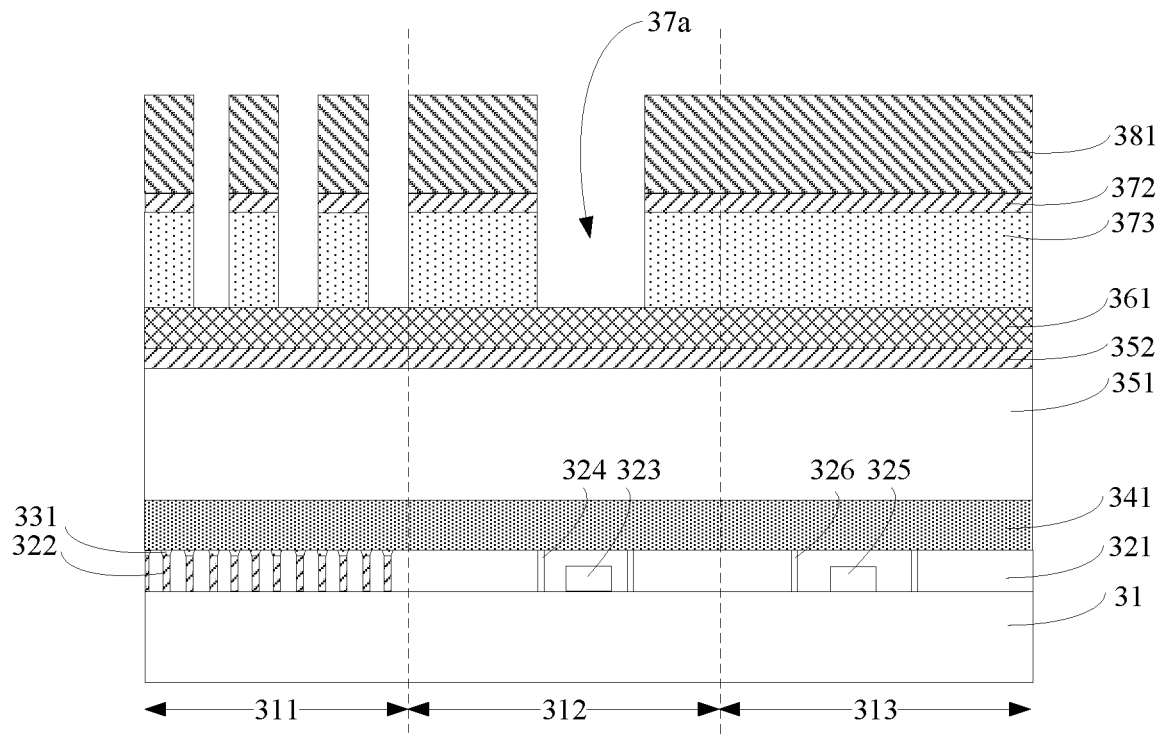
FIG. 4 is a fourth schematic diagram of a semiconductor structure corresponding to various processes in a method of manufacturing the semiconductor structure according to embodiments of the present disclosure.

Referring to FIG. 4, a first mask layer 373 is formed on the initial target film 361. The first mask layer 373 in the array region 311 and the first circuit region 312 is provided with first initial openings 37a, and the pattern density of the first initial opening 37a in the array region 311 is greater than the pattern density of the first initial opening 37a in the first circuit region 312.

In some embodiments, the process of forming the first mask layer 373 may include: forming a continuous first initial mask 371 (referring to FIG. 3) on the initial target film 361; forming a photoresist layer 381 with a first initial opening 37a on the surface of the first initial mask 371 (referring to FIG. 3); etching the first initial mask 371 by use of the photoresist layer 381 as a mask, forming a first initial opening 37a through the first initial mask 371 (referring to FIG. 3) within the first initial mask 371 (referring to FIG. 3), and using the remaining first initial mask 371 (referring to FIG. 3) as a first mask layer 373; and removing the photoresist layer 381.

The first initial mask 371 (referring to FIG. 3) may be made of carbon or carbon organic matter deposited by use of spin on coating (SOC). The SOC has a faster film formation rate and is advantageous for shortening a fabrication process. The carbon or organic matter containing carbon is relatively soft in texture and easy to be removed by etching, which is conducive to further shortening the manufacturing process of the semiconductor structure.

In some embodiments, a first isolation layer 372 may be formed on the surface of the first initial mask 371 (referring FIG. 3) before forming the photoresist layer 381. The material of the first isolation layer 372 is different from the material of the first initial mask 371 (referring to FIG. 3). For example, the material of the first isolation layer 372 may be silicon oxynitride.

Figure 5:
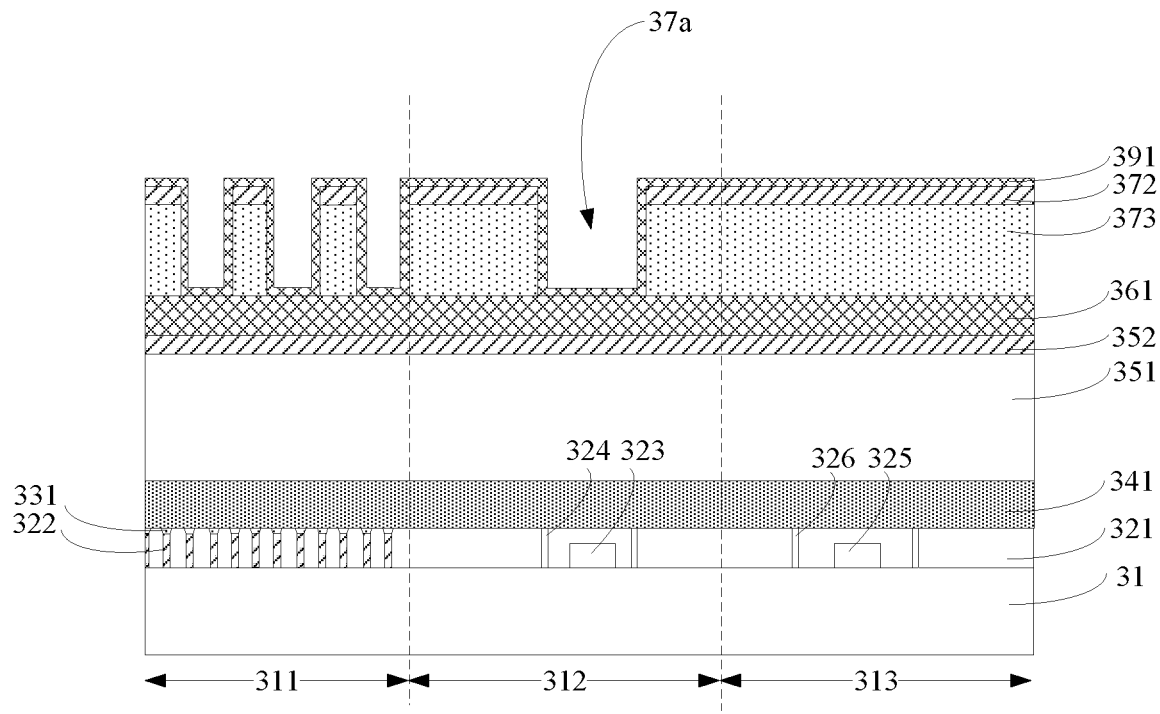
FIG. 5 is a fifth schematic diagram of a semiconductor structure corresponding to various processes in a method of manufacturing the semiconductor structure according to embodiments of the present disclosure.

Referring to FIG. 5, a first sidewall layer 391 covering the inner wall of the first initial opening 37a is formed.

The first sidewall layer 391 is configured to define the location and topography of a first opening subsequently formed within the target layer. In some embodiments, the formation of the first sidewall layer 391 by deposition facilitates the formation of the first sidewall layer 391 with a thinner thickness, and correspondingly facilitates the subsequent formation of a first opening in a smaller size, thereby reducing impacts from lithography process limits.

The material of the first sidewall layer 391 is different from the material of the first initial mask 371, and is also different from the material of the target layer. In some embodiments, the material of the first sidewall layer 391 may be silicon oxide.

In some embodiments, the first sidewall layer 391 may be formed by atomic layer deposition. The first sidewall layer 391 formed by atomic layer deposition has the advantages of good densification and good uniformity of covering the inner wall of the first initial opening 37a, which is conducive to further improving the topographic accuracy of the subsequently formed first opening.

In some embodiments, in the process of forming the first sidewall layer 391, the first sidewall layer 391 may also be formed at the bottom of the first initial opening 37a and the top surface of the first mask layer 373. That is, the first sidewall layer 391 is also located on top of the first mask layer 373 in the array region 311, the first circuit region 312, and the second circuit region 313.

It will be appreciated that in other embodiments, the first sidewall layer may also be formed only on the inner wall of the first initial opening.

Figure 6:
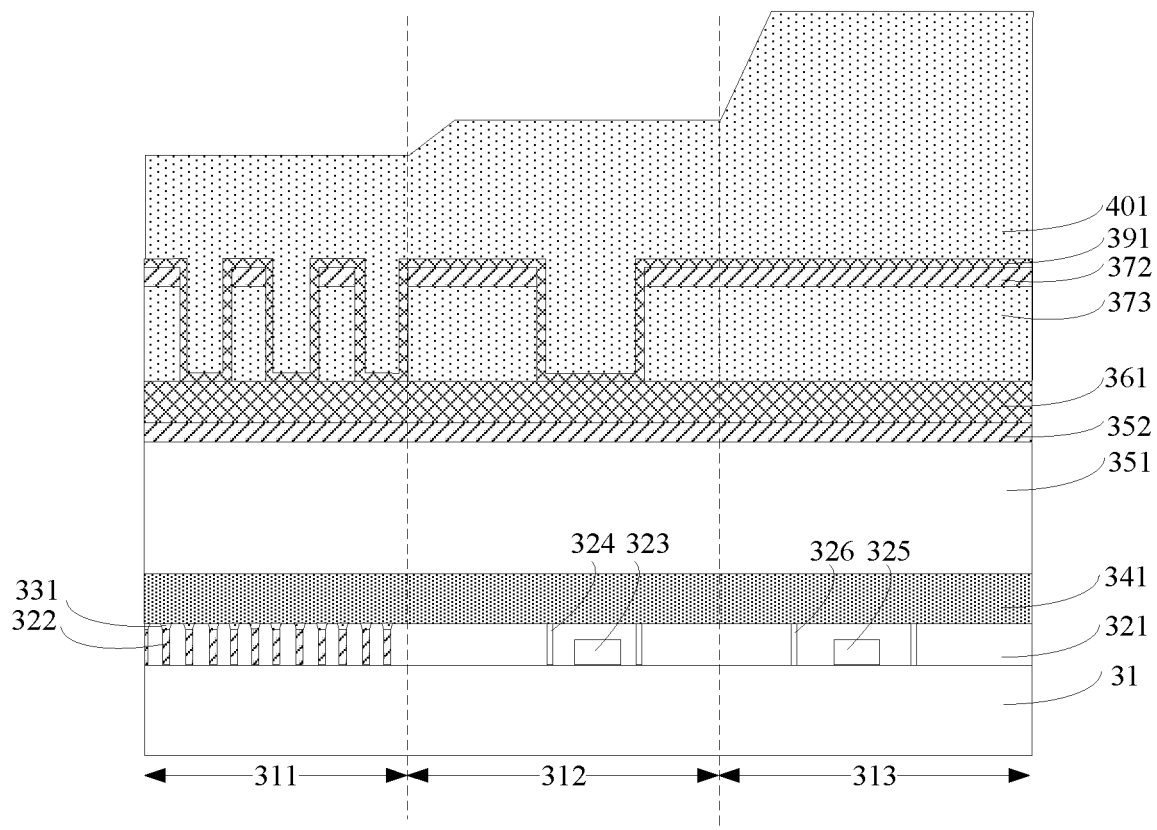
FIG. 6 is a sixth schematic diagram of a semiconductor structure corresponding to various processes in a method of manufacturing the semiconductor structure according to embodiments of the present disclosure.
Figure 7:
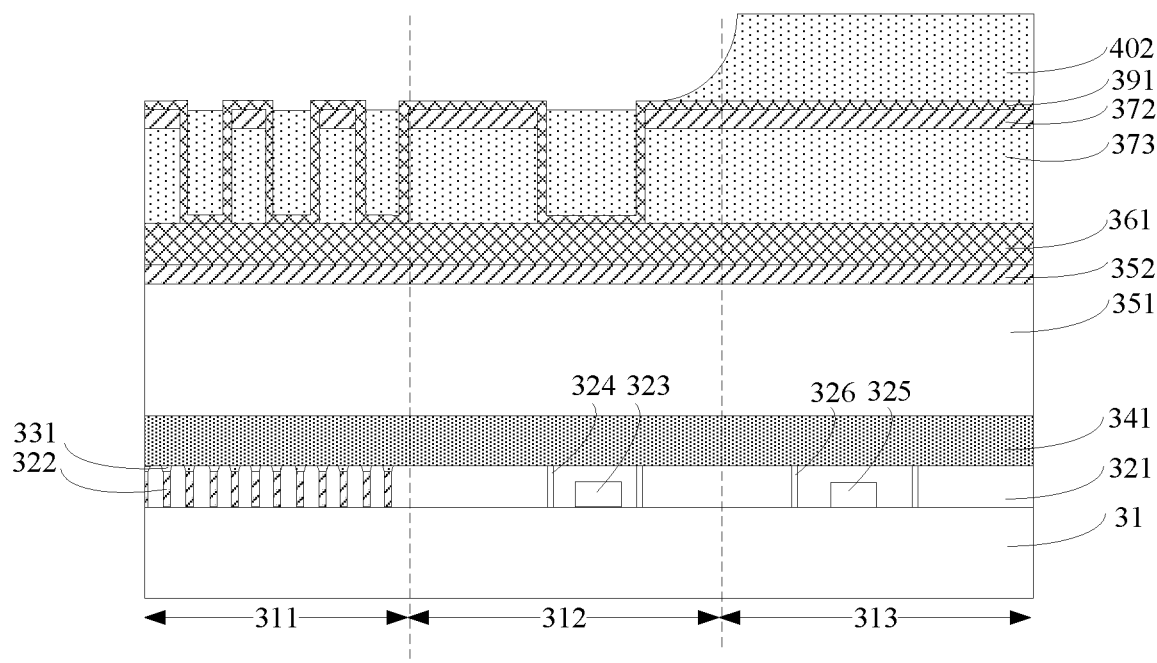
FIG. 7 is a seventh schematic diagram of a semiconductor structure corresponding to various processes in a method of manufacturing the semiconductor structure according to embodiments of the present disclosure.

Referring to FIG. 6 and FIG. 7, a second mask layer 402 is formed that covers the first sidewall layer 391 and fills the first initial opening 37a (referring to FIG. 5). The second mask layer 402 exposes the top surface of the first sidewall layer 391.

The second mask layer 402 and the first mask layer 373 are together served as a mask for etching the initial target film 361 subsequently. Accordingly, the material of the second mask layer 402 is also different from the material of the initial target film 361. The second mask layer 402 may be made of the same material as the first mask layer 373, thereby reducing the types of material and etchant required in the production process, and reducing the cost and complexity of manufacturing the semiconductor.

In some embodiments, the second mask layer 402 located in the array region 311 and the first circuit region 312 fills the first initial opening 37a (referring to FIG. 5) and exposes the top surface of the first sidewall layer 391 in the array region 311 and the first circuit region 312. The second mask layer 402 located in the second circuit region 313 is located directly above the first mask layer 373 and covers the top surface of the first sidewall layer 391 located in the second circuit region 313.

In some embodiments, the process of forming the second mask layer 402 may include the followings.

Referring to FIG. 6, a second initial mask 401 covering the first sidewall layer 391 and filling the first initial opening 37a (referring to FIG. 5) is formed, the second initial mask 401 is also located on top of the first mask layer 373, and the top-surface heights of the second initial mask 401 in the second circuit region 313, the first circuit region 312 and the array region 311 sequentially decrease.

The second initial mask 401 may be formed by a deposition process or a spin coating process. Taking the second initial mask 401 formed by the deposition process as an example, during the deposition process, the deposition rates and deposition time in different regions are the same, that is, the total amounts of materials of the second initial mask 401 in the array region 311, the first circuit region 312 and the second circuit region 313 are the same. Since the arrangement density of the first initial openings 37a (referring to FIG. 5) in the array region 311, the first circuit region 312 and the second circuit region 313 sequentially decreases, it can be understood that the total area of the openings in the array region 311 is the largest, so the more the materials of the second initial mask 401 can be accommodated in the first initial opening 37a (referring to FIG. 5) in the array region 311, the lowest the top surface of the second initial mask 401 in the array region 311 is, similarly, the top surface of the second initial mask 401 in the second circuit region 313 is the highest. That is, in the direction from the second circuit region 313 to the array region 311, the top surfaces of the second initial mask 401 sequentially decrease.

It will be appreciated that the second initial mask 401 formed by use of the spin coating process is also provided with the above top surfaces.

Referring to FIG. 7, the second initial mask 401 (referring to FIG. 6) is etched back until the top surface of the first sidewall layer 391 on the inner wall of the first initial opening 37a (referring to FIG. 5) is exposed, and the second initial mask 401 (referring to FIG. 6) is remained as the second mask layer 402.

In some embodiments, the second initial mask 401 may be etched back by use of a dry etching process (referring to FIG. 6).

Specifically, the second initial mask 401 is etched back until the top surfaces of the first sidewall layer 391 in the array region 311 and the first circuit region 312 are exposed. Since the top surface of the second initial mask 401 (referring to FIG. 6) in the second circuit region 313 has the highest height, the second mask layer 402 in the second circuit region 313 is also located on the top surface of the first sidewall layer 391 after the etch-back process is completed.

Figure 8:
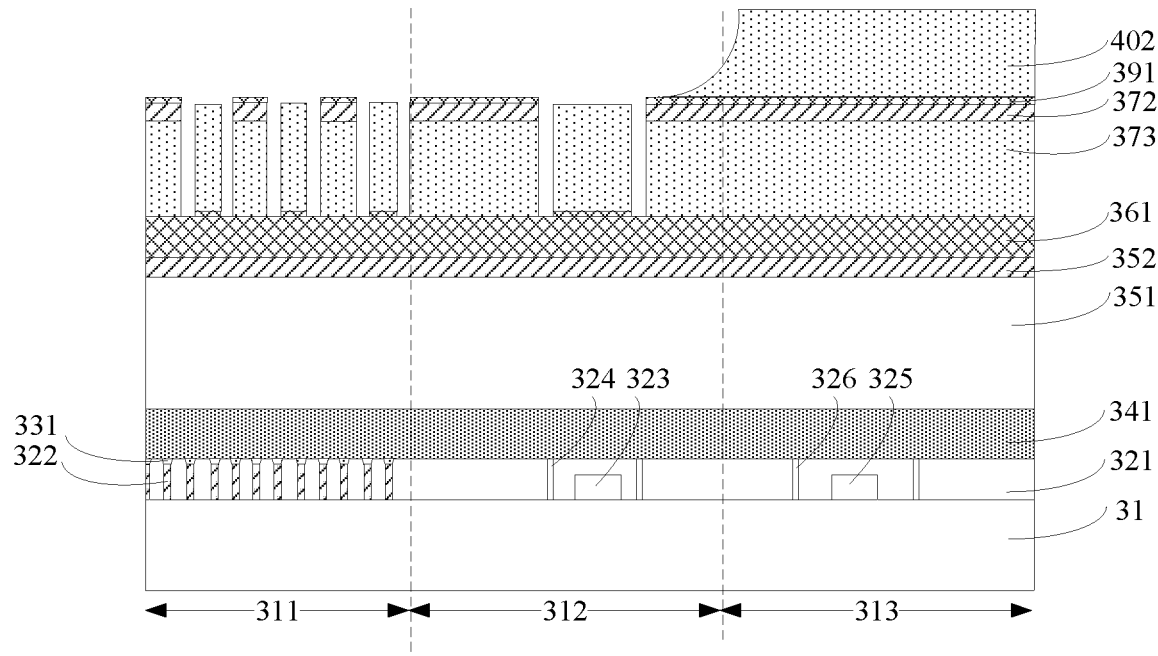
FIG. 8 is an eighth schematic diagram of a semiconductor structure corresponding to various processes in a method of manufacturing the semiconductor structure according to embodiments of the present disclosure.
Figure 9:
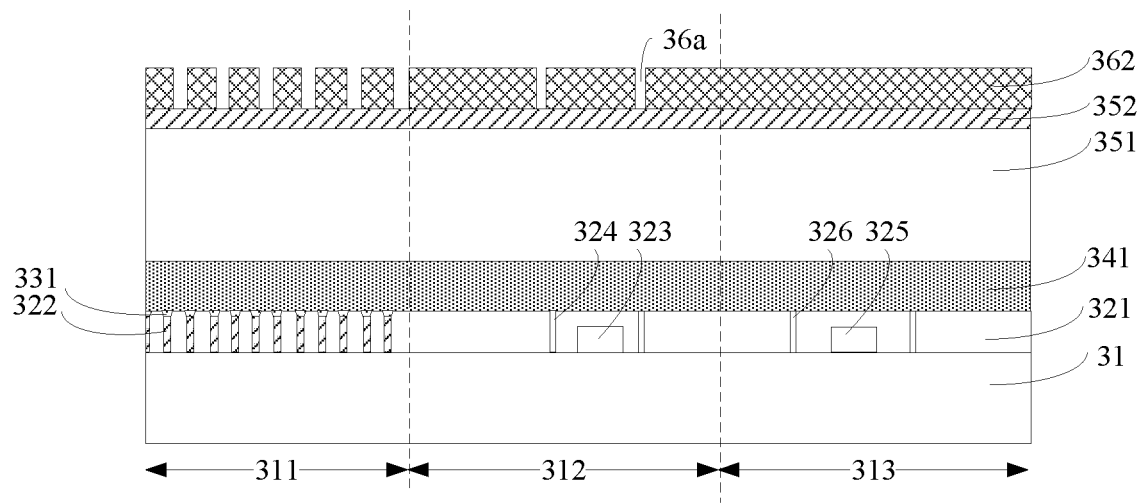
FIG. 9 is a ninth schematic diagram of a semiconductor structure corresponding to various processes in a method of manufacturing the semiconductor structure according to embodiments of the present disclosure.

Referring to FIG. 8 and FIG. 9, the first sidewall layer 391 is removed, and the initial target film 361 is etched by use of the first mask layer 373 and the second mask layer 402 as a mask to form the target layer 362.

Specifically, referring to FIG. 8, the first sidewall layer 391 located in the array region 311 and the first circuit region 312 is removed to form a gap between the first mask layer 373 and the second mask layer 402.

In some embodiments, the first sidewall layer 391 located in the array region 311 and the first circuit region 312 may be removed by use of a wet etching process.

It will be appreciated that removing the first sidewall layer 391 in the array region 311 and the first circuit region 312 refers to removing the first sidewall layer 391 located on the inner wall of the first initial opening 37a (referring to FIG. 5) and on the top surface of the first mask layer 373. Since the first sidewall layer 391 located at the bottom of the first initial opening 37a (referring to FIG. 5) is covered by the second mask layer 402, the first sidewall layer 391 located at the bottom of the first initial opening 37a (referring to FIG. 5) is not removed in this process.

Referring to FIG. 9, an initial target film 361 (referring to FIG. 8) arranged directly below the gap is etched to form a target layer 362 having a first opening 36a.

In some embodiments, the initial target film 361 may be etched by use of a dry etching process until the top surface of the intermediate layer 352 is exposed.

After the target layer 362 is formed, the remaining first sidewall layer 391 (referring to FIG. 8), the first mask layer 373 (referring to FIG. 8) and the second mask layer 402 (referring to FIG. 8) are removed.

The first opening 36a having a smaller size can be formed in such a manner that the first mask layer 373 (referring to FIG. 8) and the second mask layer 402 (referring to FIG. 8)

are superimposed, i.e., in a double-patterned manner, so that the pattern morphology and position in the target layer 362 are more accurate.

Referring to FIG. 10 to FIG. 19, the target layer 362 between adjacent first openings 36a in the array region 311 is patterned to form a second opening 36b through the target layer 362, and the target layer 362 in the first circuit region 312 and the second circuit region 313 is patterned to form a third opening 36c through the target layer 362.

In some embodiments, the target layer 362 may be provided with rows of second openings 36b arranged in a preset direction, and each of the second openings 36b has a second extension direction, the included angle between the second extension direction and the preset direction may be 60 degrees. In a plane parallel to the base 31, the orthographic projection in the first extension direction obliquely intersects the orthographic projection in the second extension direction.

The process for forming the second opening 36b in some embodiments will be described in detail below with reference to the accompanying drawings.

Figure 10:
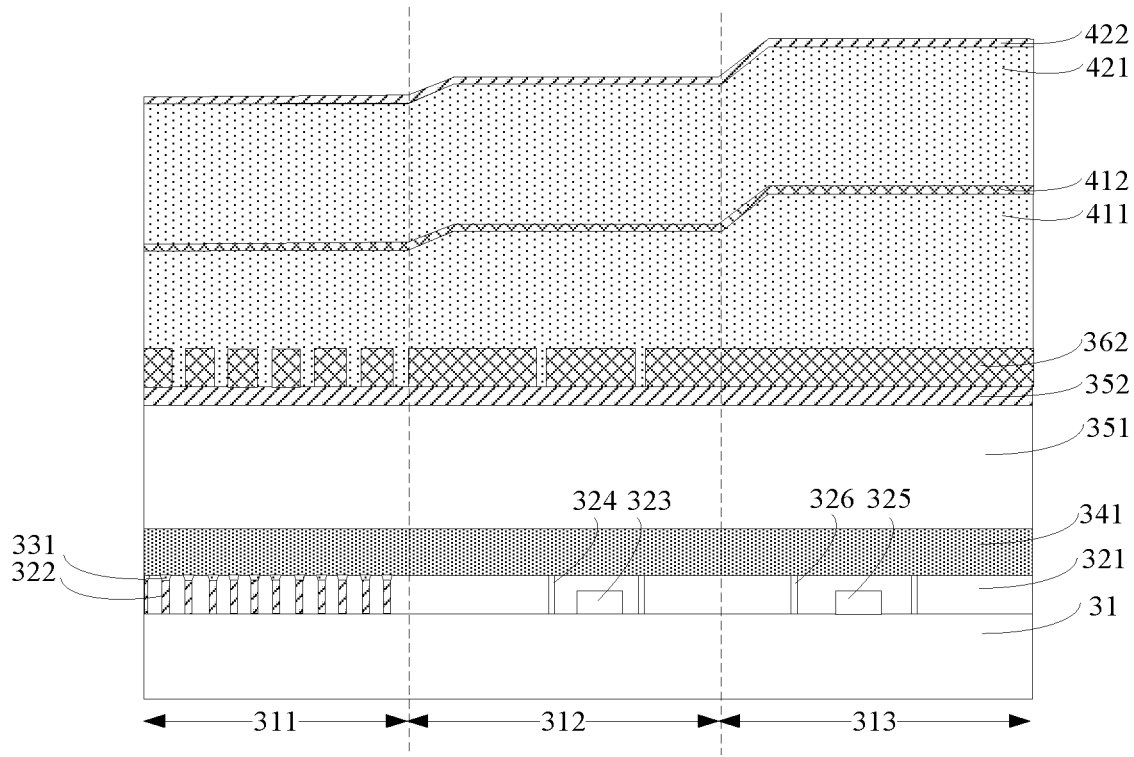
FIG. 10 is a tenth schematic diagram of a semiconductor structure corresponding to various processes in a method of manufacturing the semiconductor structure according to embodiments of the present disclosure.

Referring to FIG. 10, a third mask layer 411 is formed that fills the first opening 36a (referring to FIG. 9) and covers the top surface of the target layer 362. the top surfaces of the third mask layer 411 in the array region 311, the first circuit region 312 and the second circuit region 313 gradually increase.

The material of the third mask layer 411 is different from the material of the target layer 362. Furthermore, in some embodiments, the material of the third mask layer 411 may be carbon or carbon-containing organic matter consistent with the material of the second mask layer 402 (referring to FIG. 8) described above.

During the process of forming the third mask layer 411, the formation rates and formation time in different regions are the same. That is, the total amounts of the materials of the third mask layer 411 in the array region 311, the first circuit region 312 and the second circuit region 313 are the same. Since the arrangement density of the first openings 36a (referring to FIG. 9) in the array region 311, the first circuit region 312 and the second circuit region 313 sequentially decreases, it can be understood that the total area of the openings in the array region 311 is the largest, so the more the materials of the third mask layer 411 can be accommodated in the first opening 36a (referring to FIG. 9) in the array region 311, the lowest the top surface of the third mask layer 411 in the array region 311 is. The top surface of the third mask layer 411 in the second circuit region 313 is the highest.

Referring to FIG. 10 to FIG. 13, the first stop layer 412 and the fourth mask layer 423 are sequentially formed on the third mask layer 411, each of the fourth mask layers 423 in the array region 311 is provided with a fourth opening 42a through the fourth mask layer 423, each of the fourth mask layers 423 in the second circuit region 313 is provided with a fourth opening 42a through the fourth mask layer 423, and a second sidewall layer 392 is formed on an inner wall of the fourth opening 42a in the array region 311.

The first stop layer 412 is configured to protect the third mask layer 411, and the material of the first stop layer 412 is different from those of the third mask layer 411 and the fourth mask layer 423. In some embodiments, the material of the first stop layer 412 may be silicon oxide, and the first stop layer 412 may be formed by use of an atomic layer deposition process.

The fourth mask layer 423 is used as a mask for the target layer 362 to form a second opening 36b on the target layer 362. The material of the fourth mask layer 423 may be as same as that of the third mask layer 411.

Specifically, in some embodiments, the process of forming the fourth opening 42a and the second sidewall layer 392 may include the followings.

Figure 11:
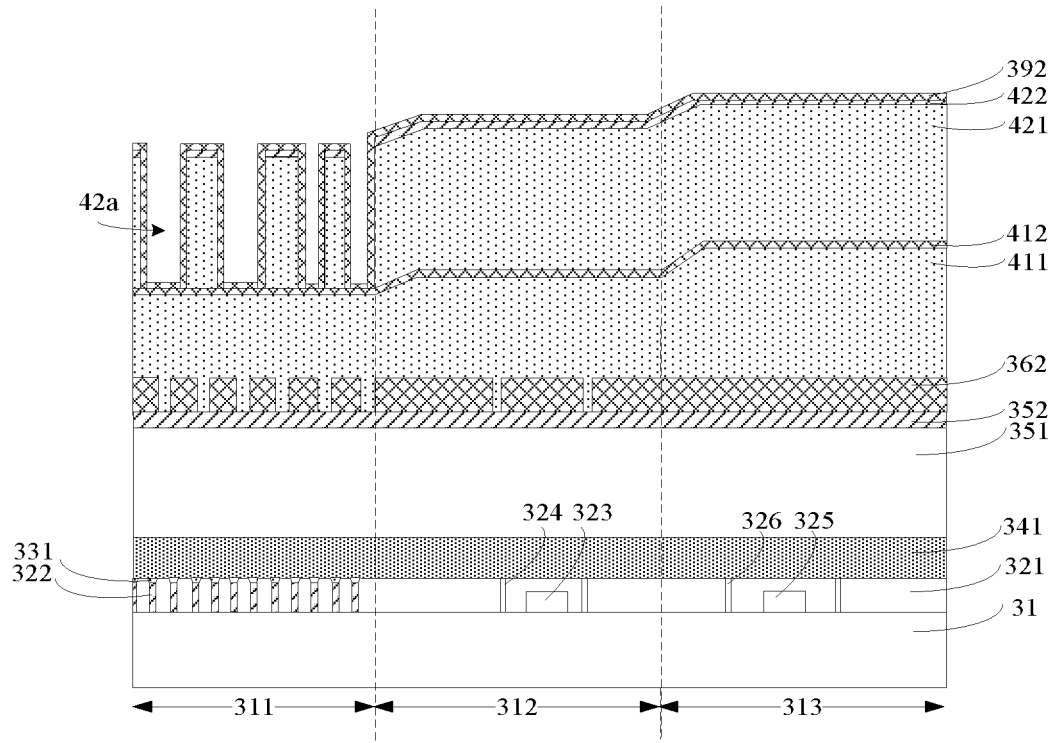
FIG. 11 is an eleventh schematic diagram of a semiconductor structure corresponding to various processes in a method of manufacturing the semiconductor structure according to embodiments of the present disclosure.

Referring to FIG. 10 and FIG. 11, a fourth initial mask 421 is formed on the first stop layer 412, and the fourth initial mask 421 in the array region 311 is provided with a fourth opening 42a through the fourth initial mask 421.

The top surfaces of the fourth initial mask 421 in the array region 311, the first circuit region 312 and the second circuit region 313 gradually increase. This is because, in the process of forming the fourth initial mask 421, the formation rates and the formation time in the different regions are the same. The top surfaces of the third mask layer 411 in the array region 311, the first circuit region 312 and the second circuit region 313 gradually increase, and the fourth initial mask 421 covers the top surface of the third mask layer 411, so that the top surfaces of the fourth initial mask 421 in the array region 311, the first circuit region 312 and the second circuit region 313 gradually increase.

Referring to FIG. 11, in some embodiments, the fourth opening 42a through the fourth initial mask 421 is formed in the fourth initial mask 421 in the array region 311.

In some embodiments, the fourth opening may be formed by use of a mask etching method.

It will be appreciated that the number and width of the fourth openings 42a may be adjusted as required.

With continued reference to FIG. 11, a second sidewall layer 392 is formed, the second sidewall layer 392 is located on the inner wall of the fourth opening 42a in the array region 311.

The material of the second sidewall layer 392 is different from those of the third mask layer 411 and the fourth initial mask 421.

In some embodiments, the second sidewall layer 392 may be formed by atomic layer deposition. The second sidewall layer 392 formed by atomic layer deposition has the advantages of good densification and good uniformity of covering the inner wall of the fourth opening 42a, which is conducive to further improving the topographic accuracy of the subsequently formed second opening.

In the process of forming the second sidewall layer 392, the second sidewall layer 392 may be also formed at the bottom of the fourth opening 42a and at the top of the fourth initial mask 421.

In other embodiments, the second sidewall layer may also be located only on the inner wall of the fourth opening.

Figure 12:
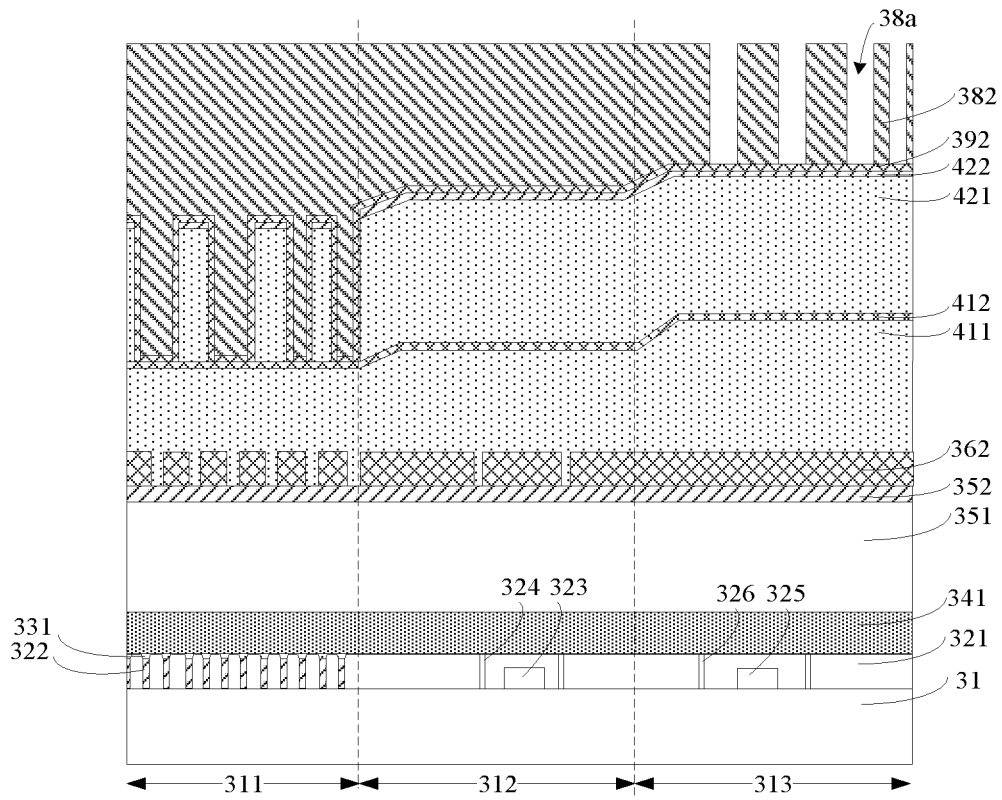
FIG. 12 is a twelfth schematic diagram of a semiconductor structure corresponding to various processes in a method of manufacturing the semiconductor structure according to embodiments of the present disclosure.
Figure 13:
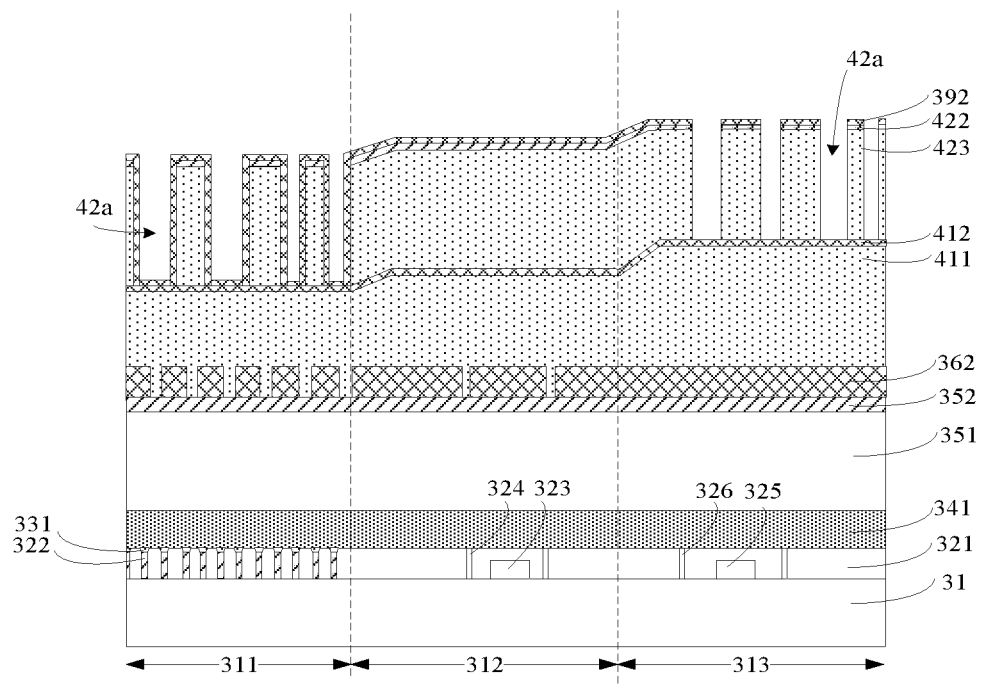
FIG. 13 is a thirteenth schematic diagram of a semiconductor structure corresponding to various processes in a method of manufacturing the semiconductor structure according to embodiments of the present disclosure.

Referring to FIG. 12 and FIG. 13, the fourth initial mask 421 in the second circuit region 313 is patterned to form the fourth opening 42a in the fourth initial mask 421 in the second circuit region 313, and the remaining fourth initial mask 421 is served as the fourth mask layer 423.

In some embodiments, patterning the fourth initial mask 421 in the second circuit region 313 may include the followings.

Referring to FIG. 12, a first pattern layer 382 is formed that fills a fourth opening 42a (referring to FIG. 11) in the array region 311. The first pattern layer 382 in the second circuit region 313 is provided with a through hole 38a through the first pattern layer 382.

The first pattern layer 382 is located in the array region 311, the first circuit region 312 and the second circuit region 313. The material of the first pattern layer 382 may be as same as that of the fourth mask layer 423.

Referring to FIG. 13, a fourth initial mask 421 in the second circuit region 313 (referring to FIG. 12) is etched by use of the first pattern layer 382 (referring to FIG. 12) as a mask to form a fourth opening 42a located in the second circuit region 313 and remove the first pattern layer 382 (referring to FIG. 12).

Specifically, a dry etching process may be employed to etch the fourth initial mask 421 (referring to FIG. 12) along the bottom of the through hole 38a (referring to FIG. 12) until the first stop layer 412 is exposed.

The function of forming the fourth opening 42a may include: the fifth mask layer will be formed subsequently. Since the second circuit region 313 is provided with the fourth opening 42a, the height of the top surface of the fifth mask layer formed in the second circuit region 313 may be reduced, and the height drop of the top surface of the fifth mask layer between different regions can be prevented from being large, thereby avoiding problems such as collapse of the fifth mask layer.

It will be appreciated that in other embodiments, the fourth opening 42a may also be not formed in the fourth initial mask 421 in the second circuit region 313.

Figure 14:
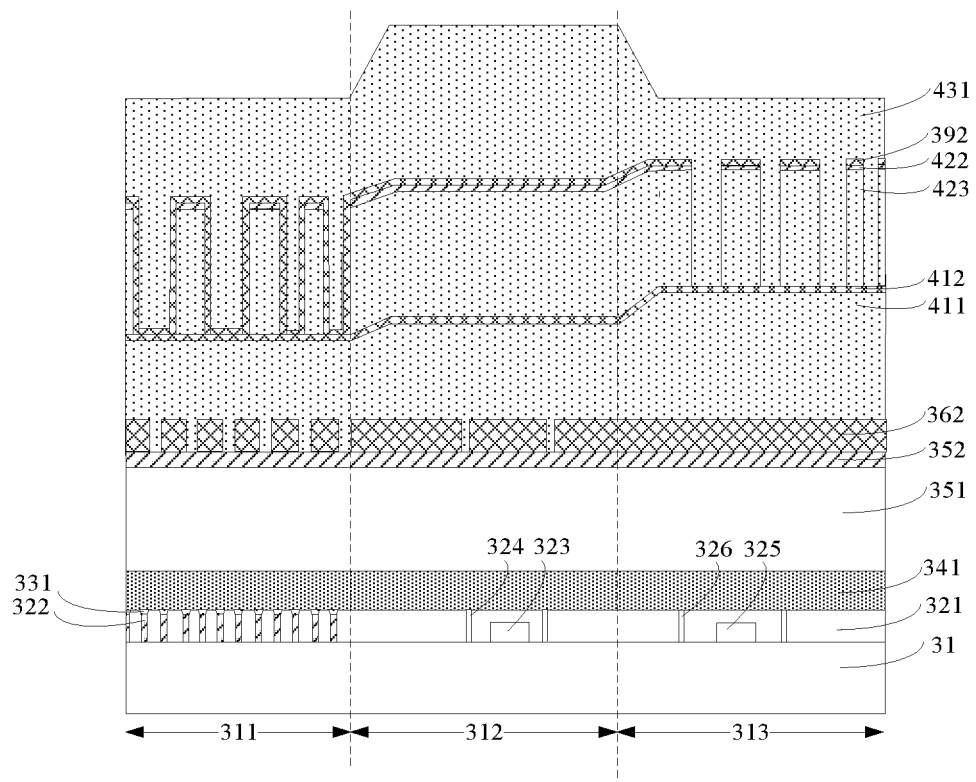
FIG. 14 is a fourteenth schematic diagram of a semiconductor structure corresponding to various processes in a FIG. 15 is a fifteenth schematic diagram of a semiconductor structure corresponding to various processes in a method of manufacturing the semiconductor structure according to embodiments of the present disclosure.

Referring to FIG. 14, a fifth mask layer 431 is formed that fills the fourth opening 42a (referring to FIG. 13) and is located on the top surface of the fourth mask layer 423. The top surface of the fifth mask layer 431 in the first circuit region 312 is higher than the top surfaces of the fifth mask layer 431 in the array region 311 and the second circuit region 313.

The material of the fifth mask layer 431 may be as same as that of the fourth mask layer 423.

During the process of forming the fifth mask layer 431, the formation rate and the formation time in the different regions are the same, that is, the total amounts of the materials of the fifth mask layer 431 in the array region 311, the first circuit region 312 and the second circuit region 313 are the same. The arrangement density of the fourth openings 42a (referring to FIG. 13) in the array region 311 is greater than the arrangement density of the fourth openings 42a (referring to FIG. 13) in the first circuit region 312, and the arrangement density of the fourth openings 42a (referring to FIG. 13) in the second circuit region 313 is greater than the arrangement density of the fourth openings 42a (referring to FIG. 13) in the first circuit region 312, so it can be understood that the total area of the openings in the array region 311 is larger than the total opening area in the first circuit region 312, so that more materials of the fifth mask layer 431 can be accommodated in the fourth openings 42a (referring to FIG. 13) in the array region 311, and the top surface of the fifth mask layer 431 in the array region 311 is lower than the top surface of the fifth mask layer 431 in the first circuit region 312, similarly, the top surface of the fifth mask layer 431 in the second circuit region 313 is lower than the top surface of the fifth mask layer 431 in the first circuit region 312. By reducing the height of the fifth mask layer 431 in the second circuit region 313, it is possible to avoid a case where a portion of the materials in the second circuit region 313 slides toward the array region 311 due to an excessive height difference of the fifth mask layer 431 between the second circuit region 313 and the array region 311.

In some embodiments, the material of the third mask layer 411, the material of the fourth mask layer 423 and the material of the fifth mask layer 431 may be the same, and all of them may be carbon or carbon-containing organic matter.

Before forming the fifth mask layer 431, the method may further include: forming the second stop layer 422 on the top surface of the fourth mask layer 423. The material of the second stop layer 422 is different from the material of the fourth mask layer 423.

The material of the second stop layer 422 may be silicon oxynitride, and the second stop layer 422 has a function of stopping etching during subsequent etching of the fifth mask layer 431.

Figure 15:
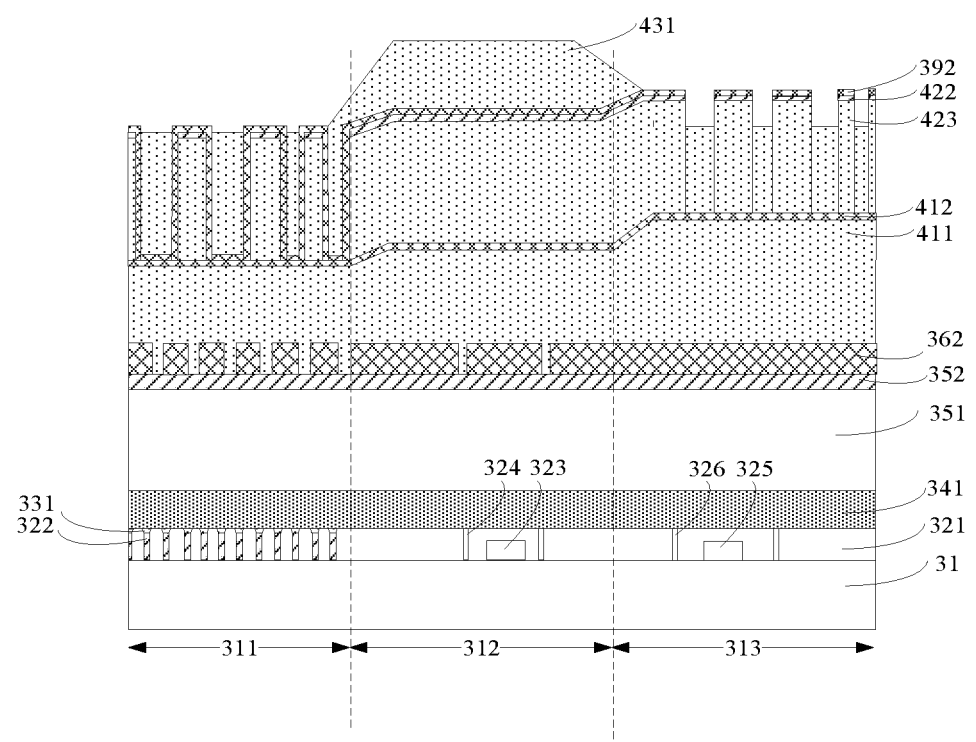

Referring to FIG. 15, the fifth mask layer 431 is etched back to expose the second sidewall layer 392 on top of the fourth mask layer 423 in the array region 311.

In some embodiments, the fifth mask layer 431 may be etched back by dry etching.

Since the thickness of the fifth mask layer 431 arranged directly above the fourth mask layer 423 in the second circuit region 312 is larger than the thickness of the fifth mask layer 431 arranged directly above the fourth mask layer 423 in the array region 311, a portion of the fifth mask layer 431 within the fourth opening 42a (referring FIG. 13) in the second circuit region 312 is removed in addition to etching and removing the fifth mask layer 431 directly arranged above the fourth mask layer 423 in the second circuit region 312 in the process of etching back the fifth mask layer 431.

Figure 16:
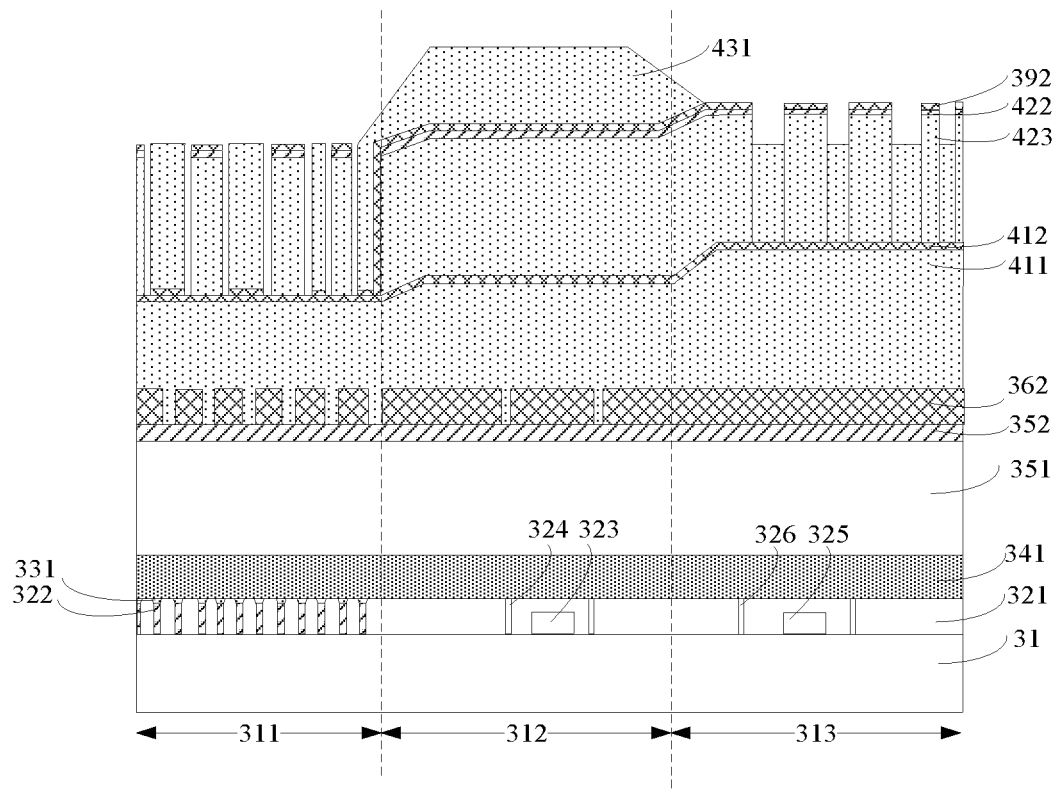
FIG. 16 is a sixteenth schematic diagram of a semiconductor structure corresponding to various processes in a method of manufacturing the semiconductor structure according to embodiments of the present disclosure.
Figure 17:
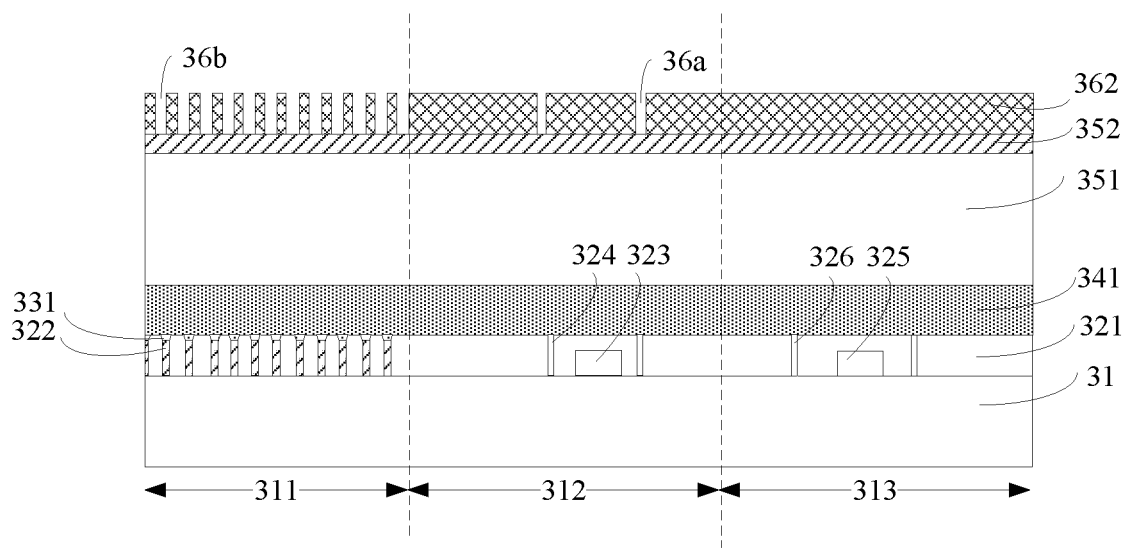
FIG. 17 is a seventeenth schematic diagram of a semiconductor structure corresponding to various processes in a method of manufacturing the semiconductor structure according to embodiments of the present disclosure.

Referring to FIG. 16 and FIG. 17, the second sidewall layer 392 is removed, and the third mask layer 411 and the target layer 362 are etched by use of the fifth mask layer 431 and the fourth mask layer 423 as a mask to form the second openings 36b.

Referring to FIG. 16, the second sidewall layer 392 is removed.

Specifically, the second sidewall layer 392 between the fourth mask layer 423 and the fifth mask layer 431 in the array region 311 is removed until the surface of the first stop layer 412 is exposed. The second sidewall layer 392 on the top surface of the fourth mask layer 423 in the array region 311 may also be removed.

In some embodiments, wet etching may be employed to remove the second sidewall layer.

Referring to FIG. 17, the third mask layer 411 (referring to FIG. 16) and the target layer 362 are etched by use of the fifth mask layer 431 (referring to FIG. 16) and the fourth mask layer 423 (referring to FIG. 16) as a mask to form second openings 36b.

In some embodiments, a dry etching process may be employed to etch the first stop layer 412 (referring to FIG. 16), the third mask layer 411 (referring to FIG. 16) and the target layer 362 until the surface of the intermediate layer 352 is exposed.

After forming the second opening, the fifth mask layer 431 (referring to FIG. 16), the second sidewall layer 392 (referring to FIG. 16), the second stop layer 422 (referring to FIG. 16), the fourth mask layer 423 (referring to FIG. 16), the first stop layer 412 (referring to FIG. 16) and the third mask layer 411 (referring to FIG. 16) are removed.

The process for forming the third opening provided in some embodiments will be described below with reference to FIG. 18 and FIG. 19.

Figure 18:
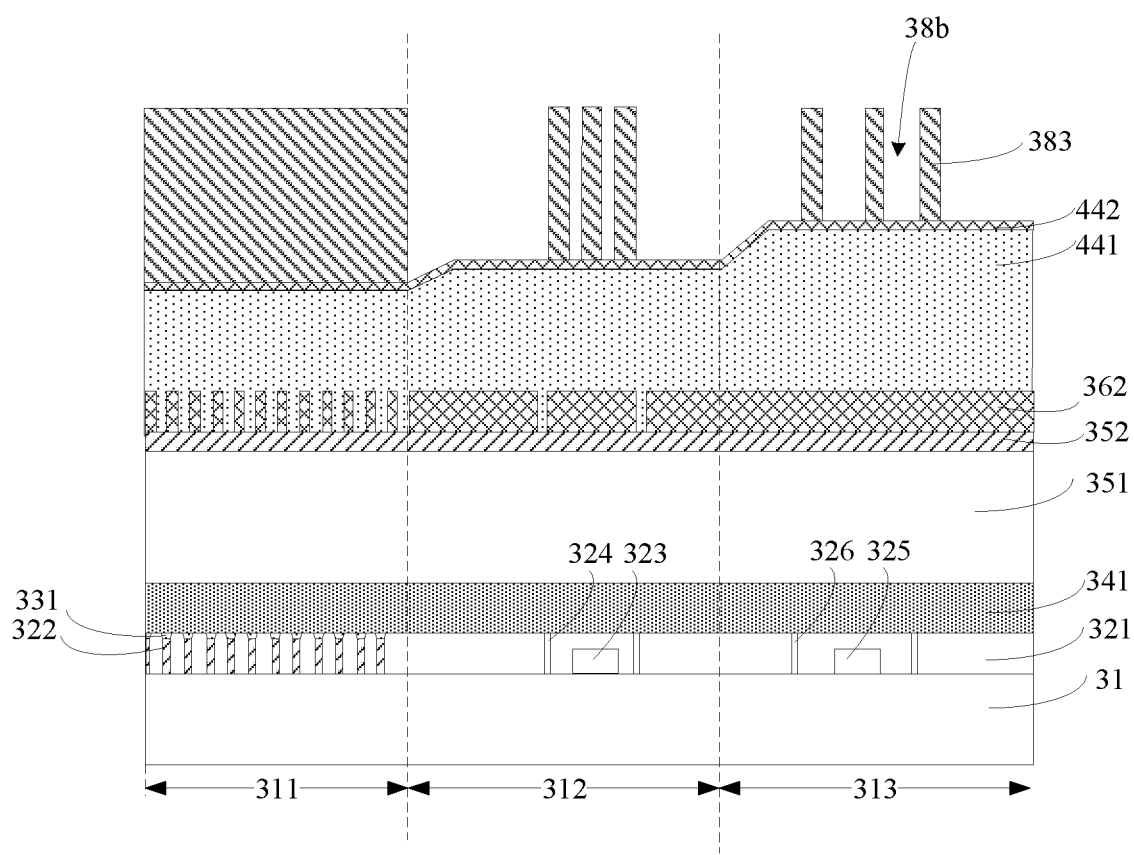
FIG. 18 is an eighteenth schematic diagram of a semiconductor structure corresponding to various processes in a method of manufacturing the semiconductor structure according to embodiments of the present disclosure.

Referring to FIG. 18, a sixth mask layer 441 is formed that fills the second opening 36b and is located on the top surface of the target layer 362. The top surfaces of the sixth mask layer 441 in the array region 311, the first circuit region 312 and the second circuit region 313 gradually increase.

During the process of forming the sixth mask layer 441, the formation rates and formation time in different regions are the same, that is, the total amounts of the materials of the sixth mask layer 441 in the array region 311, the first circuit region 312, and the second circuit region 313 are the same.

Since the arrangement density of the openings in the array region 311, the first circuit region 312, and the second circuit region 313 sequentially decreases, it can be understood that the total area of the openings in the array region 311 is the largest, so the more the materials of the sixth mask layer 441 can be accommodated in the openings in the array region 311, the lowest the top surface of the third mask layer 411 in the array region 311 is.

In some embodiments, the material of the sixth mask layer 441 may be as same as that of the fifth mask layer 431 (referring to FIG. 16)

In some embodiments, a third stop layer 442 is also formed on the top surface of the sixth mask layer 441, the material of the third stop layer 442 is different from the material of the sixth mask layer 441.

The material of the third stop layer 442 may be silicon oxynitride, and the third stop layer 442 has a function of stopping etching during subsequent etching of the sixth mask layer 441.

With continued reference to FIG. 18, a second pattern layer 383 is formed on the sixth mask layer 441, and each of the second pattern layers 383 in the first circuit region 312 and the second circuit region 313 is provided with a trench 38b through the second pattern layer 383.

In some embodiments, the second pattern layer 383 may be a photoresist layer.

In some embodiments, a third stop layer 442 may be also formed after forming the sixth mask layer 441 and before forming the second pattern layer 383. The material of the third stop layer 442 may be as same as the material of the second stop layer 422 (referring to FIG. 16), thereby reducing the types of materials required for production. The third stop layer 442 has a function of stopping etching during subsequent etching of the sixth mask layer 441.

Figure 19:
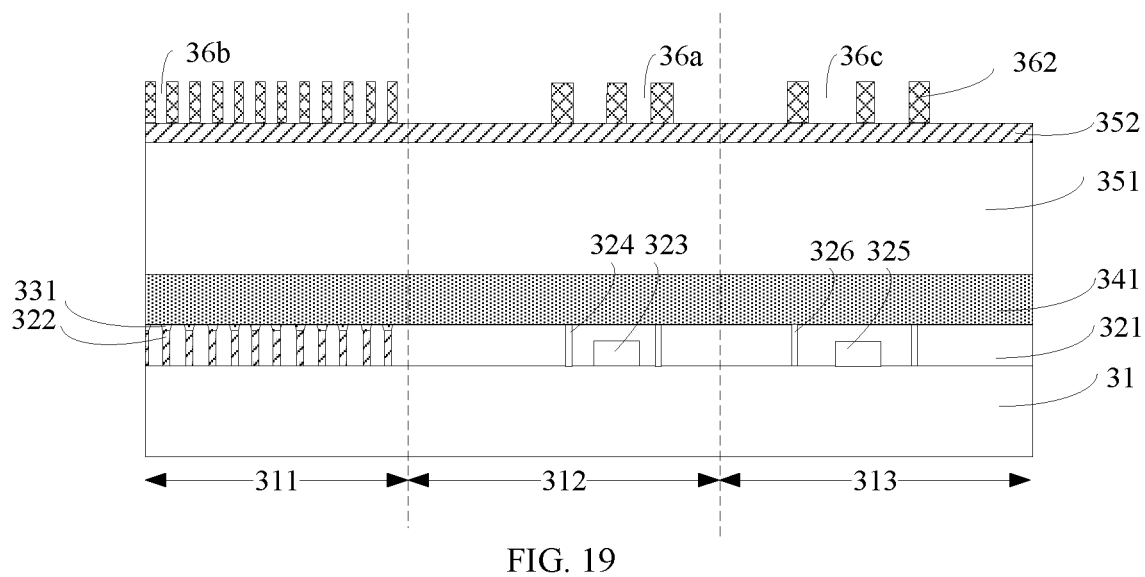
FIG. 19 is a nineteenth schematic diagram of a semiconductor structure corresponding to various processes in a method of manufacturing the semiconductor structure according to embodiments of the present disclosure.

Referring to FIG. 19, the sixth mask layer 441 (referring to FIG. 18) is etched by use of the second pattern layer 383 (referring to FIG. 18) as a mask until the target layer 362 is exposed, and then the target layer 362 is etched by use of the sixth mask layer 441 (referring to FIG. 18) as a mask to form the third opening 36c.

After forming the third opening 36c, the second pattern layer 383 (referring to FIG. 18), the third stop layer 442 (referring to FIG. 18) and the sixth mask layer 441 (referring to FIG. 18) are removed.

Figure 20:
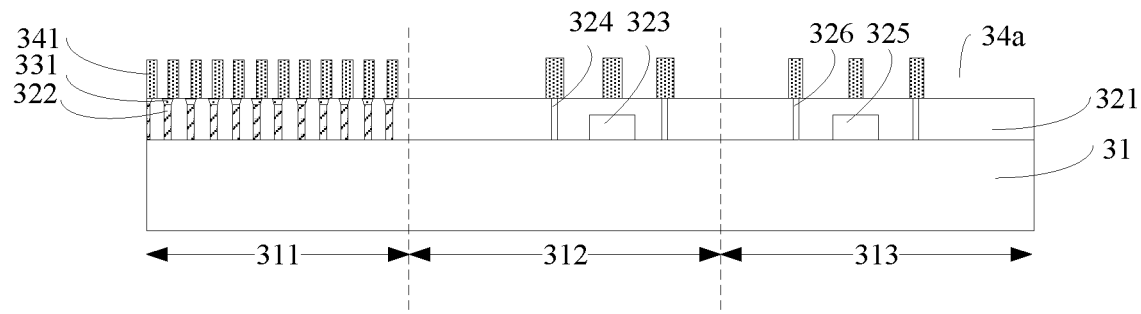
FIG. 20 is a twentieth schematic diagram of a semiconductor structure corresponding to various processes in a method of manufacturing the semiconductor structure according to embodiments of the present disclosure.

Referring to FIG. 20, the intermediate layer 352 (referring to FIG. 19), the amorphous carbon layer 351 (referring to FIG. 19) and the conversion layer 341 are sequentially etched by use of the target layer 362 (referring to FIG. 19) having the first opening 36a (referring to FIG. 19), the second opening 36b (referring to FIG. 19) and the third opening 36c (referring to FIG. 19) as a mask to form the first trench 34a within the conversion layer 341.

In some embodiments, the conversion layer 341 may be etched by use of a dry etching process.

After forming the first trench 34a, the target layer 362 (referring to FIG. 19), the intermediate layer 352 (referring to FIG. 19) and the amorphous carbon layer 351 (referring to FIG. 19) are removed.

Figure 21:
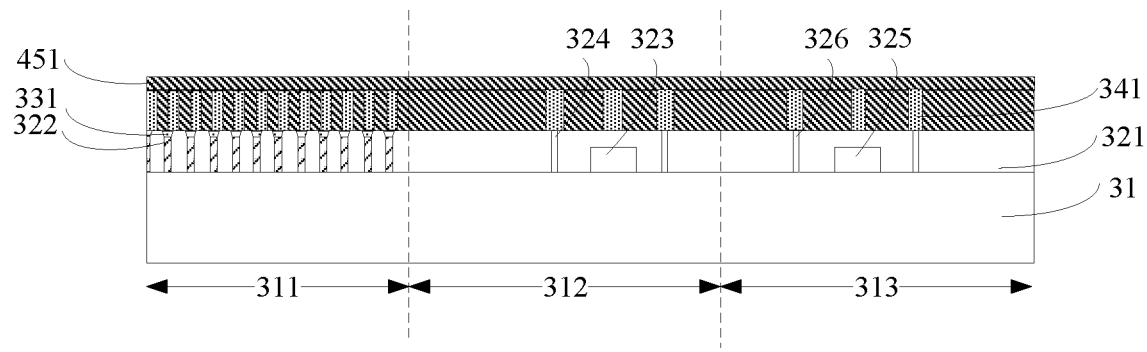
FIG. 21 is a twenty-first schematic diagram of a semiconductor structure corresponding to various processes in a method of manufacturing the semiconductor structure according to embodiments of the present disclosure.
Figure 22:
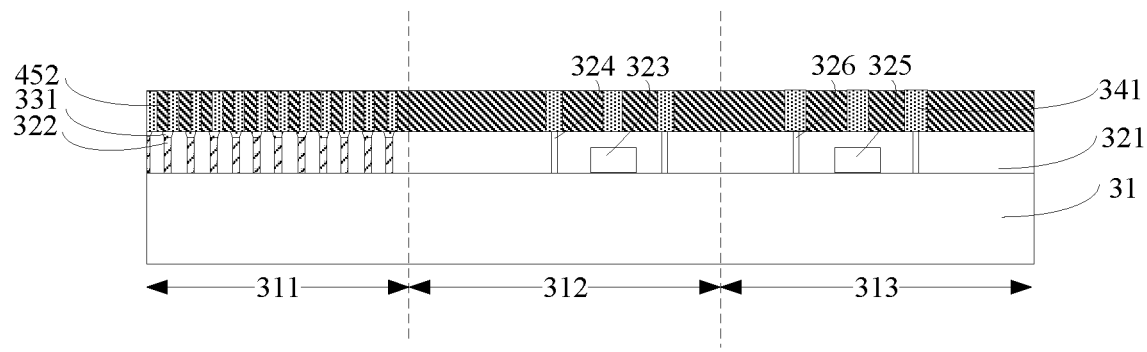
FIG. 22 is a twenty-second schematic diagram of a semiconductor structure corresponding to various processes in a method of manufacturing the semiconductor structure according to embodiments of the present disclosure.

Referring to FIG. 21 and FIG. 22, a filling layer 452 is formed that fills the first trench 34a (referring to FIG. 20).

Specifically, referring to FIG. 21, an initial filling film 451 is formed, and the initial filling film 451 also covers the top surface of the conversion layer 341.

Referring to FIG. 22, an initial filling film 451 on the top surface of the conversion layer 341 is removed (referring to FIG. 21) to form a filling layer 452.

In some embodiments, the material of the filling layer 452 may be not the same as the material of the conversion layer 341, and the material of the filling layer 452 may be silicon nitride.

The filling layer 452 is configured to ensure the pattern accuracy in forming the second conductive layer.

Figure 23:
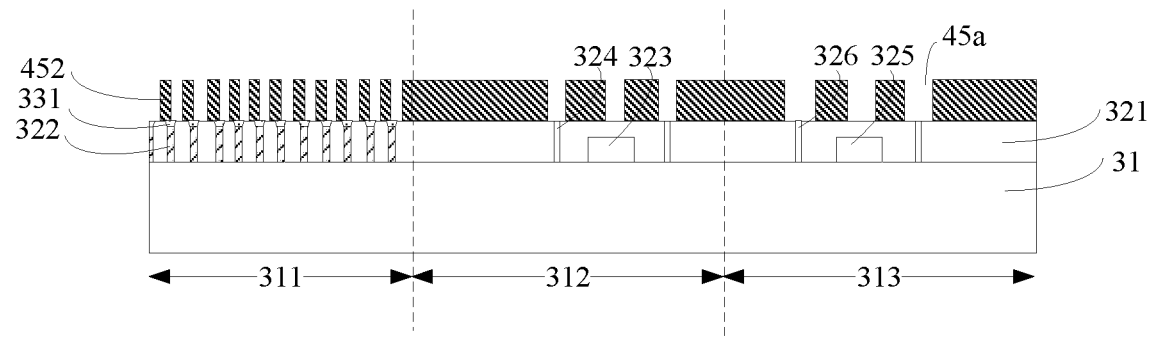
FIG. 23 is a twenty-third schematic diagram of a semiconductor structure corresponding to various processes in a method of manufacturing the semiconductor structure according to embodiments of the present disclosure.

Referring to FIG. 23, the conversion layer 341 (referring to FIG. 22) is removed to form a second trench 45a through the filling layer 452. The second trench 45a in the array region 311 exposes the top surface of the first conductive layer 331, the second trench 45a in the first circuit region 312 exposes the top surface of the first conductive plug 324, and the second trench 45a in the second circuit region 313 exposes the top surface of the second conductive plug 326.

Figure 24:
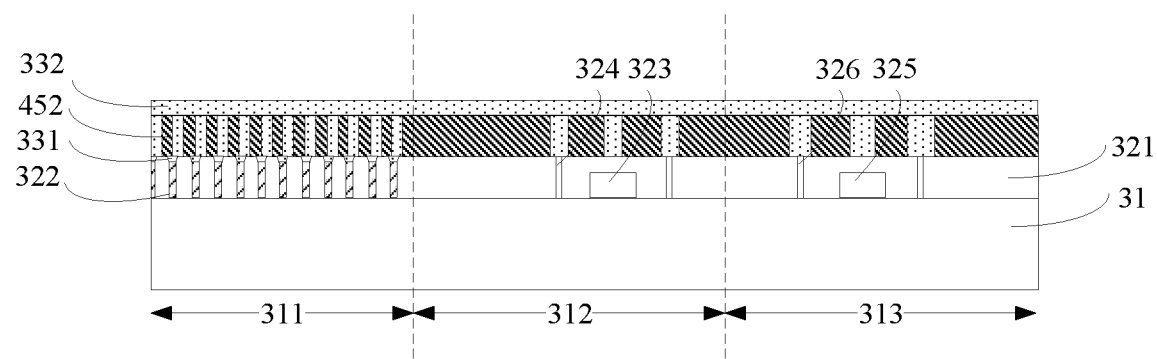
FIG. 24 is a twenty-fourth schematic diagram of a semiconductor structure corresponding to various processes in a method of manufacturing the semiconductor structure according to embodiments of the present disclosure.
Figure 25:
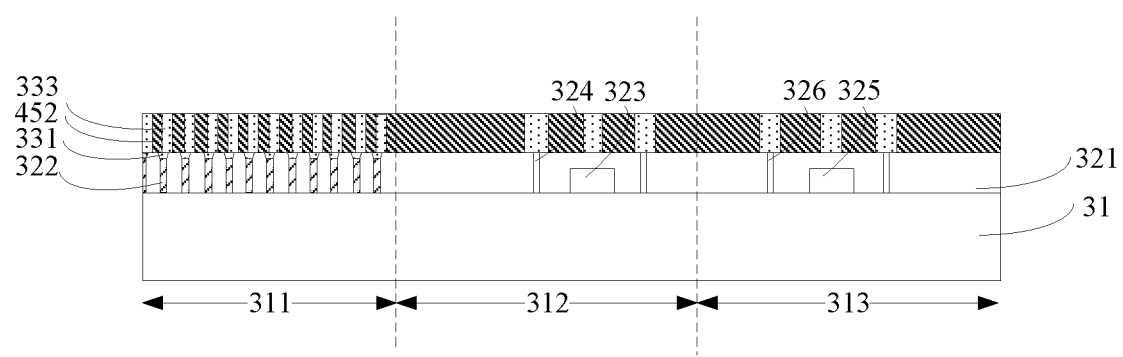
FIG. 25 is a twenty-fifth schematic diagram of a semiconductor structure corresponding to various processes in a method of manufacturing the semiconductor structure according to embodiments of the present disclosure.

Referring to FIG. 24 and FIG. 25, a second conductive layer 333 is formed that fill the second trenches 45a (referring to FIG. 23).

Specifically, in some embodiments, the process of forming the second conductive layer 333 may include: forming a conductive film 332 filling the second trenches 45a (referring to FIG. 23). The conductive film 332 is also located on the top surface of the filling layer 452. The conductive film 332 above the top surface of the filling layer 452 is removed, and the remaining conductive film 332 is served as the second conductive layer 333.

The second conductive layer 333 is configured to electrically connect with the capacitive contact plug 322, the first conductive plug 324 and the second conductive plug 326 in the dielectric layer 321.

In some embodiments, the material of the second conductive layer 333 may be metal, or may be as same as the material of the first conductive layer 331, or may be tungsten metal or the like, which is conducive to reducing the probability of occurrence of abnormalities due to different materials between the second conductive layer 333 and the first conductive layer 331, thereby improving the yield of the semiconductor structure.

It will be appreciated that the formation of the second conductive layer 333 on the surface of the dielectric layer 321 may be completed by some of the processes described above.

In the embodiments of the present disclosure, the filling layer having the second trench is formed on the dielectric layer, and then the target material is filled into the target pattern in the filling layer to form the required second conductive layer, so that the thickness of the second conductive layer can be controlled by controlling the thickness of the filling layer perpendicular to the semiconductor base, and the second conductive layer with an accurate pattern can be formed, thereby improving the performance of the semiconductor structure.

The embodiments of the present disclosure further provides a semiconductor structure. Referring to FIG. 25, the semiconductor structure includes a semiconductor structure manufactured by some or all of the above processes. It should be noted that the parts that are as same as or corresponding to the above embodiments may be referred to the corresponding description in the above embodiments, which will not be repeated hereafter.

Specifically, a base 31 including an array region 311, a first circuit region 312 and a second circuit region 313 as well as a dielectric layer 321 located on the base 31 are provided, the first circuit region 312 is located between the array region 311 and the second circuit region 313, the base 31 in the array region 311 is provided with discrete capacitive contact plugs 322, the base 31 in the first circuit region 312 is provided with a first gate 323 and the first circuit region 312 is further provided with first conductive plugs 324 on opposite sides of the first gate 323, the base 31 in the second circuit region 313 is provided with a second gate 325 and the second circuit region 313 is further provided with second conductive plugs 326 on opposite sides of the second gate 325; the first gate 323, the second gate 325 and the capacitive contact plugs 322 are located within the dielectric layer 321, and a first conductive layer 331 is located on a top surface of the capacitive contact plug 322, the second conductive layer 333 covers a portion of a top surface of the first conductive layer 331, and the filling layer 452 fills a trench within the second conductive layer 333.

In the embodiments of the present disclosure, the performance of a semiconductor structure is improved because the semiconductor structure has a second conductive layer with precise pattern and controllable thickness.

Those of ordinary skill in the art will appreciate that the above embodiments are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure, and therefore, the protection scope of the present disclosure shall be subject to the scope defined in the claims.

In the embodiments of the present disclosure, a conversion layer is patterned on a surface of a base, and then a filling layer filling a first trench is formed, and the conversion layer is removed to form a second trench, and then a target conductive material is filled in the second trench to form a second conductive layer. The second conductive layer is formed by deposition, and the thickness of the second conductive layer may be adjusted according to requirements, and the second conductive layer with precise pattern may be provided, which is conducive to improving the performance of the semiconductor structure.

What is claimed is:

1. A method of manufacturing a semiconductor structure, comprising:
providing a base and a dielectric layer located on the base, wherein the base comprises an array region, a first circuit region and a second circuit region, and the first circuit region is located between the array region and the second circuit region; the base in the array region is provided with discrete capacitive contact plugs; the base in the first circuit region is provided with a first gate and the first circuit region is further provided with first conductive plugs on opposite sides of the first gate; the base in the second circuit region is provided with a second gate and the second circuit region is further provided with second conductive plugs on opposite sides of the second gate; the first gate, the second gate and the capacitive contact plugs are located within the dielectric layer; and a first conductive layer is formed on a top surface of the capacitive contact plugs;
forming a conversion layer and a target layer sequentially on the first conductive layer and the dielectric layer, wherein the target layer in the array region and the first circuit region is provided with first openings through the target layer, and a pattern density of the first openings in the array region is greater than a pattern density of the first openings in the first circuit region;
patterning the target layer between adjacent first openings in the array region to form a second opening through the target layer, and patterning the target layer in the first circuit region and the second circuit region to form a third opening through the target layer;
etching the conversion layer by use of the target layer having the first opening, the second opening and the third opening as a mask to form a first trench within the conversion layer;
forming a filling layer that fills the first trench and removing the conversion layer to form a second trench through the filling layer, wherein the second trench in the array region exposes a top surface of the first conductive layer, the second trench in the first circuit region exposes a top surface of the first conductive plug, and the second trench in the second circuit region exposes atop surface of the second conductive plug; and
forming a second conductive layer that fills the second trench.

2. The method of manufacturing a semiconductor structure according to claim 1, wherein said forming the target layer comprises:
forming an initial target film on the conversion layer;
forming a first mask layer on the initial target film, wherein the first mask layer in the array region and the first circuit region is provided with first initial openings, and a pattern density of the first initial opening in the array region is greater than a pattern density of the first initial opening in the first circuit region;
forming a first sidewall layer covering an inner wall of the first initial opening;
forming a second mask layer covering the first sidewall layer and filling the first initial opening, wherein the second mask layer exposes a top surface of the first sidewall layer; and
removing the first sidewall layer, and etching the initial target film by use of the first mask layer and the second mask layer as a mask to form the target layer.

3. The method of manufacturing a semiconductor structure according to claim 2, wherein a material of the first mask layer is as same as a material of the second mask layer.

4. The method of manufacturing a semiconductor structure according to claim 2, wherein said forming the second mask layer comprises:
forming a second initial mask covering the first sidewall layer and filling the first initial opening, wherein the second initial mask is located on top of the first mask layer, and top-surface heights of the second initial mask in the second circuit region, the first circuit region and the array region sequentially decrease; and
etching back the second initial mask until the top surface of the first sidewall layer on the inner wall of the first initial opening is exposed, and using the remaining second initial mask as the second mask layer.

5. The method of manufacturing a semiconductor structure according to claim 2, wherein in the process of forming the first sidewall layer, the first sidewall layer is formed at a bottom of the first initial opening and at a top surface of the first mask layer; and
the formed second mask layer exposes the first sidewall layer located on the top surface of the first mask layer.

6. The method of manufacturing a semiconductor structure according to claim 1, wherein said forming the second opening comprises:
forming a third mask layer filling the first opening and covering a top surface of the target layer, and forming a first stop layer and a fourth mask layer sequentially on the third mask layer, wherein the fourth mask layer in the array region and the second circuit region is provided with fourth openings through the fourth mask layer, and a second sidewall layer is formed on an inner wall of the fourth opening in the array region;

forming a fifth mask layer filling the fourth opening and located on a top surface of the fourth mask layer, wherein a top surface of the fifth mask layer in the first circuit region is higher than a top surface of the fifth mask layer in the array region and the second circuit region;

etching back the fifth mask layer to expose the second sidewall layer on top of the fourth mask layer in the array region; and removing the second sidewall layer, etching the third mask layer and the target layer by use of the fifth mask layer and the fourth mask layer as a mask to form the second opening.

7. The method of manufacturing a semiconductor structure according to claim 6, wherein materials of the third mask layer and the fourth mask layer are as same as a material of the fifth mask layer;

before forming the fifth mask layer, the method further comprises:

forming a second stop layer on the top surface of the fourth mask layer, wherein a material of the second stop layer is different from the material of the fourth mask layer.

8. The method of manufacturing a semiconductor structure according to claim 6, wherein said forming the fourth opening and the second sidewall layer comprises:

forming a fourth initial mask on the first stop layer, wherein the fourth initial mask in the array region is provided with the fourth opening through the fourth initial mask;

forming the second sidewall layer located on an inner wall of the fourth opening in the array region; and patterning the fourth initial mask in the second circuit region to form the fourth opening within the fourth initial mask in the second circuit region, using the remaining fourth initial mask as the fourth mask layer.

9. The method of manufacturing a semiconductor structure according to claim 8, wherein said patterning the fourth initial mask in the second circuit region comprises:

forming a first pattern layer filling the fourth opening in the array region, wherein the first pattern layer in the second circuit region is provided with a through hole through the first pattern layer;

etching the fourth initial mask in the second circuit region by use of the first pattern layer as a mask to form the fourth opening located in the second circuit region; and removing the first pattern layer.

10. The method of manufacturing a semiconductor structure according to claim 6, wherein in the process of etching back the fifth mask layer, a portion of the fifth mask layer located within the fourth opening in the second circuit region is further etched and removed.

11. The method of manufacturing a semiconductor structure according to claim 1, wherein said forming the third opening comprises:

forming a sixth mask layer filling the second opening and located on a top surface of the target layer;

forming a second pattern layer located on the sixth mask layer, wherein the second pattern layer in the first circuit region and the second circuit region is provided with trenches through the second pattern layer; and etching the sixth mask layer by use of the second pattern layer as a mask until the target layer is exposed, and then etching the target layer by use of the sixth mask layer as a mask to form the third opening.

12. The method of manufacturing a semiconductor structure according to claim 1, wherein after said forming the conversion layer and before forming the target layer, the method further comprises:

sequentially forming an amorphous carbon layer and an intermediate layer on the conversion layer; and forming the target layer on a surface of the intermediate layer.

13. The method of manufacturing a semiconductor structure according to claim 1, wherein a material of the conversion layer comprises silicon nitride or polysilicon; a material of the target layer comprises tetraethyl orthosilicate (TEOS).

14. The method of manufacturing a semiconductor structure according to claim 1, wherein said forming the second conductive layer comprises:

forming a conductive film filling the second trench, wherein the conductive film is also located on a top surface of the filling layer; and removing the conductive film higher than the top surface of the filling layer, using the remaining conductive film as the second conductive layer.

15. The method of manufacturing a semiconductor structure according to claim 1, wherein a material of the second conductive layer is metal.

16. The method of manufacturing a semiconductor structure according to claim 14, wherein a material of the second conductive layer is metal.

17. A semiconductor structure manufactured by the method according to claim 1.

18. The semiconductor structure according to claim 17, wherein a material of the first mask layer is as same as a material of the second mask layer.

19. The semiconductor structure according to claim 17, wherein a material of the conversion layer comprises silicon nitride or polysilicon; a material of the target layer comprises tetraethyl orthosilicate (TEOS).

* * * * *